(12) United States Patent
Ziger et al.

(10) Patent No.: US 7,537,939 B2
(45) Date of Patent: May 26, 2009

(54) SYSTEM AND METHOD FOR CHARACTERIZING LITHOGRAPHY EFFECTS ON A WAFER

(75) Inventors: David Ziger, San Antonio, TX (US); Steven Qian, Plano, TX (US)

(73) Assignee: NXP B.V., Eindhoven (NL)

( * ) Notice: Subject to any disclaimer, the term of this patent is extended or adjusted under 35 U.S.C. 154(b) by 532 days.

(21) Appl. No.: 10/554,791

(22) PCT Filed: Apr. 27, 2004

(86) PCT No.: PCT/IB2004/001267

§ 371 (c)(1), (2), (4) Date: Oct. 27, 2005

(87) PCT Pub. No.: WO2004/097528

PCT Pub. Date: Nov. 11, 2004

(65) Prior Publication Data

US 2007/0275329 A1    Nov. 29, 2007

Related U.S. Application Data

(60) Provisional application No. 60/466,490, filed on Apr. 29, 2003.

(51) Int. Cl.
G01R 31/26 (2006.01)
H01L 21/66 (2006.01)

(52) U.S. Cl. .............. 438/14; 438/48; 438/78; 257/E27.075; 257/E27.084

(58) Field of Classification Search .......... 438/14, 438/48, 78; 430/22, 30, 5; 257/213, 229, 257/E27.075, E27.084; 324/71.5, 206; 355/40, 355/67, 69

See application file for complete search history.

(56) References Cited

U.S. PATENT DOCUMENTS

| 4,409,686 A | 10/1983 | Ports et al. |
| 5,757,507 A | 5/1998 | Ausschnitt et al. |
| 5,902,703 A | 5/1999 | Leroux et al. |

(Continued)

FOREIGN PATENT DOCUMENTS

| EP | 1065567 A1 | 1/2001 |
| WO | 0237186 A1 | 5/2002 |
| WO | 2004097528 A3 | 11/2004 |

OTHER PUBLICATIONS

PCT International Preliminary Report on Patentability. Jul. 20, 2006, 10pp.

Primary Examiner—Walter L Lindsay, Jr.
Assistant Examiner—Abdulfattah Mustapha
(74) Attorney, Agent, or Firm—Peter Zawilski

(57) ABSTRACT

In the manufacture of semiconductors, it is often necessary to characterize the effect of line width and line width shape on yield. In an example embodiment, there is a method (200) for randomizing exposure conditions across a substrate. The method comprises generating a list of random numbers (210). A random number is mapped (220) to an exposure field, forming a list of random numbers and corresponding exposure fields. The list or random numbers and corresponding exposure fields is sorted (230) by random number. To each exposure field in the list sorted by random number, an exposure dose is assigned (240). The list is sorted is sorted by exposure field (250).

11 Claims, 6 Drawing Sheets

U.S. PATENT DOCUMENTS

Figure 1:
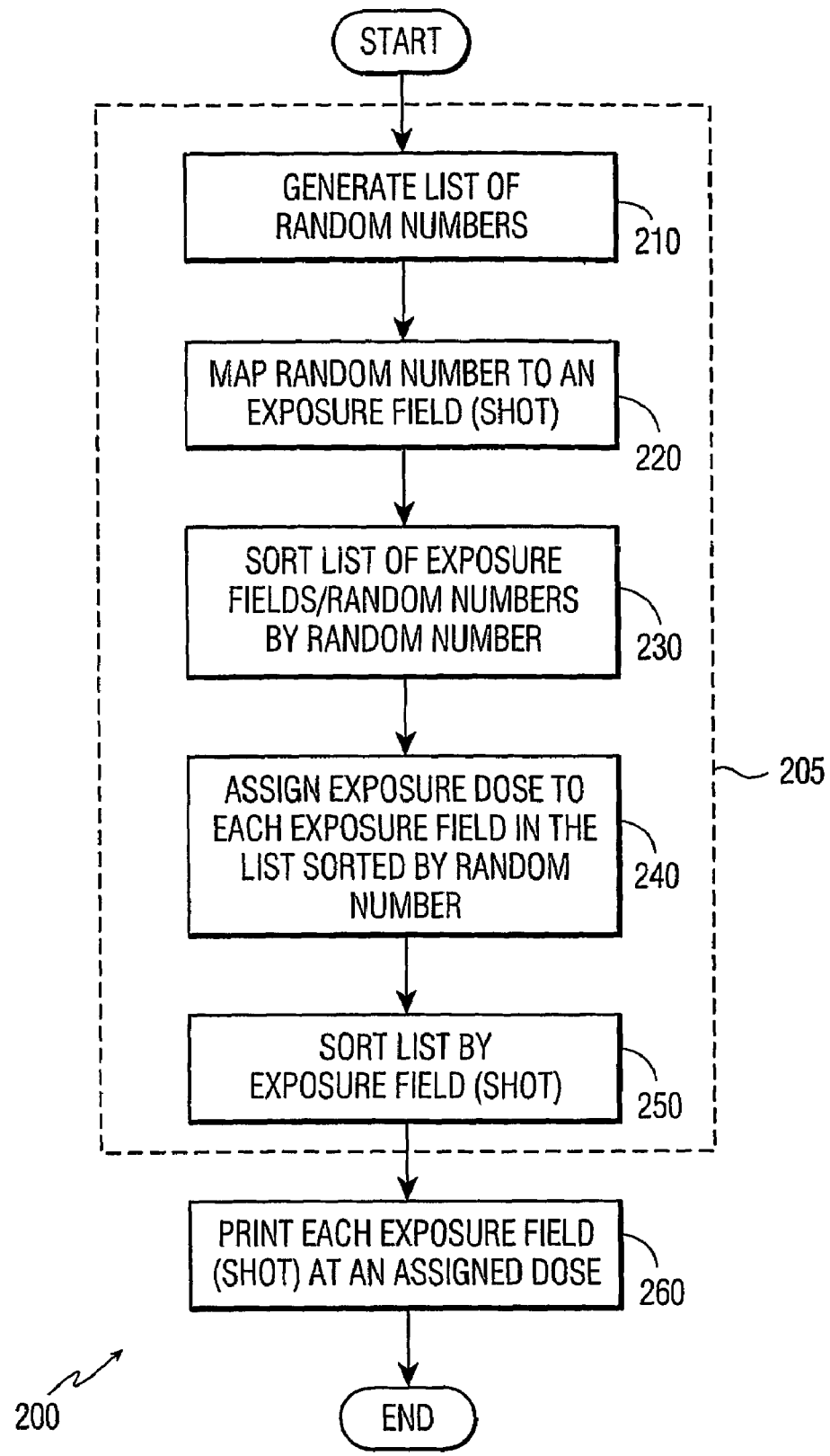

| | | |
|---|---|---|
| 5,962,173 A | 10/1999 | Leroux et al. |
| 5,976,738 A * | 11/1999 | Nakashima ................. 430/22 |
| 5,976,741 A | 11/1999 | Ziger et al. |
| 6,301,008 B1 | 10/2001 | Ziger et al. |
| 6,456,736 B1 | 9/2002 | Su et al. |
| 6,546,125 B1 | 4/2003 | Su |
| 2002/0182516 A1 | 12/2002 | Bowes |
| 2004/0168147 A1 * | 8/2004 | Dai et al. ..................... 716/19 |
| 2006/0094040 A1 * | 5/2006 | Hubbell et al. ................. 435/6 |

* cited by examiner

SYSTEM AND METHOD FOR CHARACTERIZING LITHOGRAPHY EFFECTS ON A WAFER

CROSS REFERENCE TO RELATED APPLICATION

This application claims the benefit of U.S. provisional application Ser. No. 60/466,490 filed 29 Apr. 2003, which is incorporated herein by reference.

The invention relates to semiconductor processing. More particularly the invention relates to the determining effects of process changes in pursuit of improving performance of the photolithographic process.

The electronics industry continues to rely upon advances in semiconductor technology to realized higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulative material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

One important step in the manufacturing of such devices is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features to be printed on the substrate. After exposure, the resist-coated wafer substrate is developed. The desired features as defined on the mask are retained on the photo resist-coated substrate. Unexposed areas of resist are washed away with a developer. The wafer having the desired features defined is subjected to etching. Depending upon the production process, the etching may either be a wet etch, in which liquid chemicals are used to remove wafer material or a dry etch, in which wafer material is subjected to a radio frequency (RF) induced plasma.

Often desired features have particular regions in which the final printed and etched regions have to be accurately reproduced over time. These are referred to as critical dimensions (CDs). As device geometry approaches the sub-micron realm, wafer fabrication becomes more reliant on maintaining consistent CDs over normal process variations. The active device dimensions as designed and replicated on the photo mask and those actually rendered on the wafer substrate have to be repeatable and controllable. In many situations, the process attempts to maintain the final CDs equal to the masking CDs. However, imperfections in the process or changes in technology (that may be realized in a given fabrication process, if the process were "tweaked") often necessitate the rendering of final CDs that deviate from the masking CDs.

To improve the quality of printing, it is often necessary to characterize the effect of line width and line width shape on yield. Typically, wafers are exposed at a variety of conditions at one or more critical layers and then probed for yield. For example, it is common to quantify the effect of gate width on yield by exposing wafers at different doses to create a variety of line sizes. Typically, each wafer is exposed at a different exposure and perhaps, focus value. Since silicon and processing costs are expensive, it is desirable to obtain the same information on a wafer; that is, expose wafers with an array of doses and perhaps focuses.

U.S. Pat. No. 5,757,507 of Ausschnitt et al. relates generally to manufacturing processes requiring lithography and, more particularly, to monitoring of bias and overlay error in lithographic and etch processes used in microelectronics manufacturing which is particularly useful more monitoring pattern features with dimensions on the order of less than 0.5 µm.

U.S. Pat. No. 5,962,173 of Leroux et al. relates generally to the field of fabricating integrated circuits and more particularly to maintaining accuracy in the fabrication of such circuits having extremely narrow line elements such as gate lines.

U.S. Pat. No. 5,902,703 of Leroux et al. relates generally to the field of fabricating integrated circuits and more particularly to maintaining accuracy in the fabrication of such circuits having relatively narrow line elements such as gate lines. The invention is also directed to the verification of stepper lens fabrication quality.

U.S. Pat. No. 5,976,741 of Ziger et al. relates generally to methods of determining illumination exposure dosages and other processing parameters in the field of fabricating integrated circuits. More particularly, the invention concerns methods of processing semiconductor wafers in step and repeat systems.

U.S. Pat. No. 6,301,008 B1 of Ziger et al. relates to semiconductor devices and their manufacture, and more particularly, to arrangements and processes for developing relatively narrow line widths of elements such as gate lines, while maintaining accuracy in their fabrication.

U.S. Patent Application US 2002/0182516 A1 of Bowes relates generally to metrology of semiconductor manufacturing processes. More particularly, the present invention is a needle comb reticle pattern for simultaneously making critical dimension (CD) measurements of device features and registration measurements of mask overlays relative to semiconductor wafers during processing of semiconductor wafers. This reference and those previously cited are herein incorporated by reference in their entirety.

In an example process data is obtained by exposing an array of exposure doses (or focuses) on different columns or rows of dies on a wafer substrate. In the example process, dies are printed at multiple exposure doses. Each column of die may be exposed at particular exposure dose. As the user steps across the wafer the exposure dose may be increased. There are a number of challenges to address, however. First, unrelated across-wafer yield losses may be confounded with the exposed array. Second, a more subtle challenge is typically, exposure fields comprise multiple die (as in masks used in a wafer stepper). In the case of an exposure field comprised of very small die, the relationship between the exposure and sort maps can be easily offset which can lead to incorrect assumptions regarding yield versus critical line width. Sort maps are die-by-die plots across the wafer substrate having active devices of electrical measurements performed on a completed wafer having active devices (e.g, "wafer sort"). Sort maps are electrical test results of die tested on a wafer, these die may comprise electrical test patterns and circuits or may be devices that have end-user applications, for example, memory devices, microprocessors, microcontrollers, amplifiers, application specific integrated circuits (ASICS), etc. Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

Over time, a given wafer substrate with a particular example product will exhibit sort maps characteristic of the processing the wafer substrate received in its fabrication. Correlation between sort and stepper maps becomes more difficult as the number of chips per wafer increase. Additionally, stepper maps can be intentionally offset in either or both the horizontal and vertical directions further complicating the correlation of the two maps. Thus, there is a need for a method to address two challenges of exposure characterization at the wafer level, the confounding of yield with systemic defects and the alignment of exposure fields with yield maps.

In example embodiment, there is a method for manufacturing a wafer having a substrate. The method comprises randomly assigning numbers to exposure fields for the substrate. Using the randomly assigning numbers, exposure parameters are assigned to the respective exposure fields. The wafers are processed according to the assigned exposure parameters.

In another example embodiment, there is a method for randomizing exposure conditions across a substrate that comprises generating a list of random numbers. A random number is mapped to an exposure field. A list of random numbers and corresponding exposure fields is formed and is sorted by random number. An exposure does is assigned to each exposure field in the listed sorted by random number and the list is sorted by exposure field. A feature of this embodiment is that the exposure field may be printed at the assigned exposure dose.

In another example embodiment, there is a method for characterizing lithography effects on a wafer. The method comprises determining an effect to study and determining a number of exposure fields to print. At least one reference die location is selected. A randomization procedure is performed. The reference die is printed at an exposure to make the reference die conspicuous. Each exposure field is printed at the assigned exposure dose. Electrical measurements are performed on the wafer and electrical measurements are correlated with line width.

In yet another example embodiment, a system characterizes lithography effects on a wafer. The system comprises means for generating a list of random numbers, means for mapping a random number to an exposure field, forming a list of random numbers and corresponding exposure fields. There are means for sorting the list of random numbers and exposure fields by random number and means for sorting the list by exposure field. After sorting the list, there are means for printing the exposure field at an assigned dose. A feature of this embodiment further comprises means for selecting at least one reference die location and means for printing the reference die at an exposure to make the reference die conspicuous.

The above summaries of the present invention are not intended to represent each disclosed embodiment, or every aspect, of the present invention. Other aspects and example embodiments are provided in the figures and the detailed description that follows.

Figure 2A:
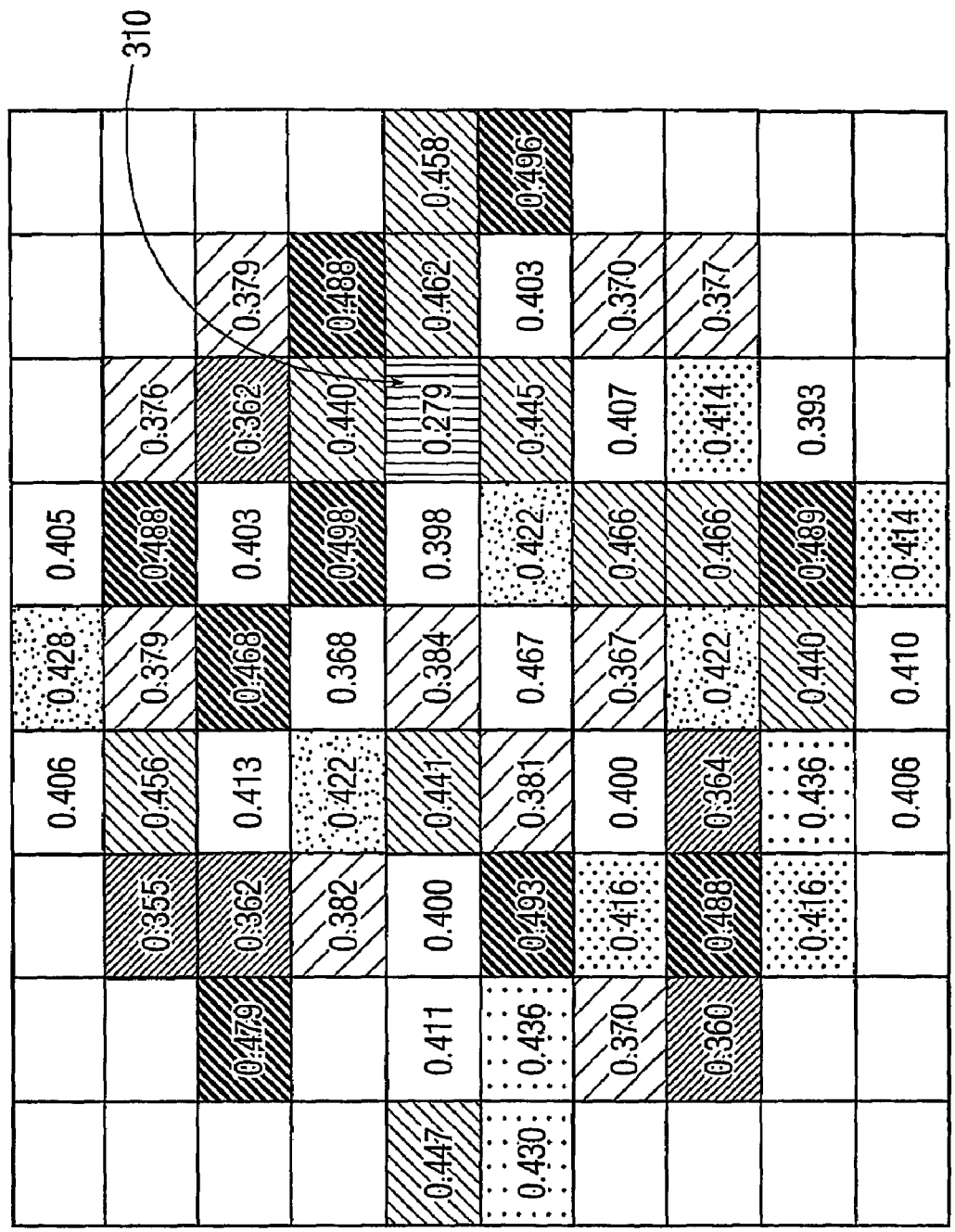
Figure 2B:
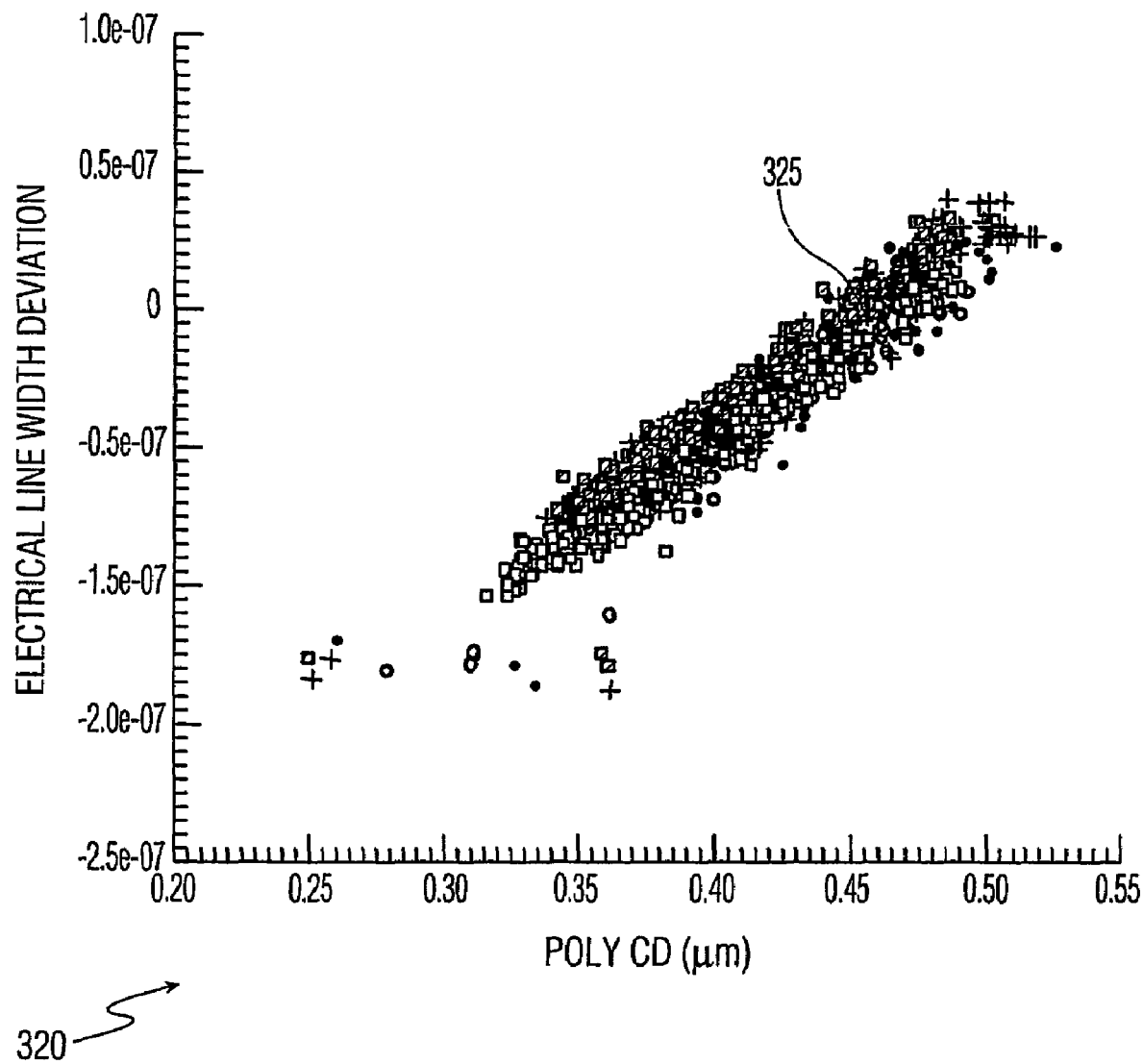
Figure 2C:
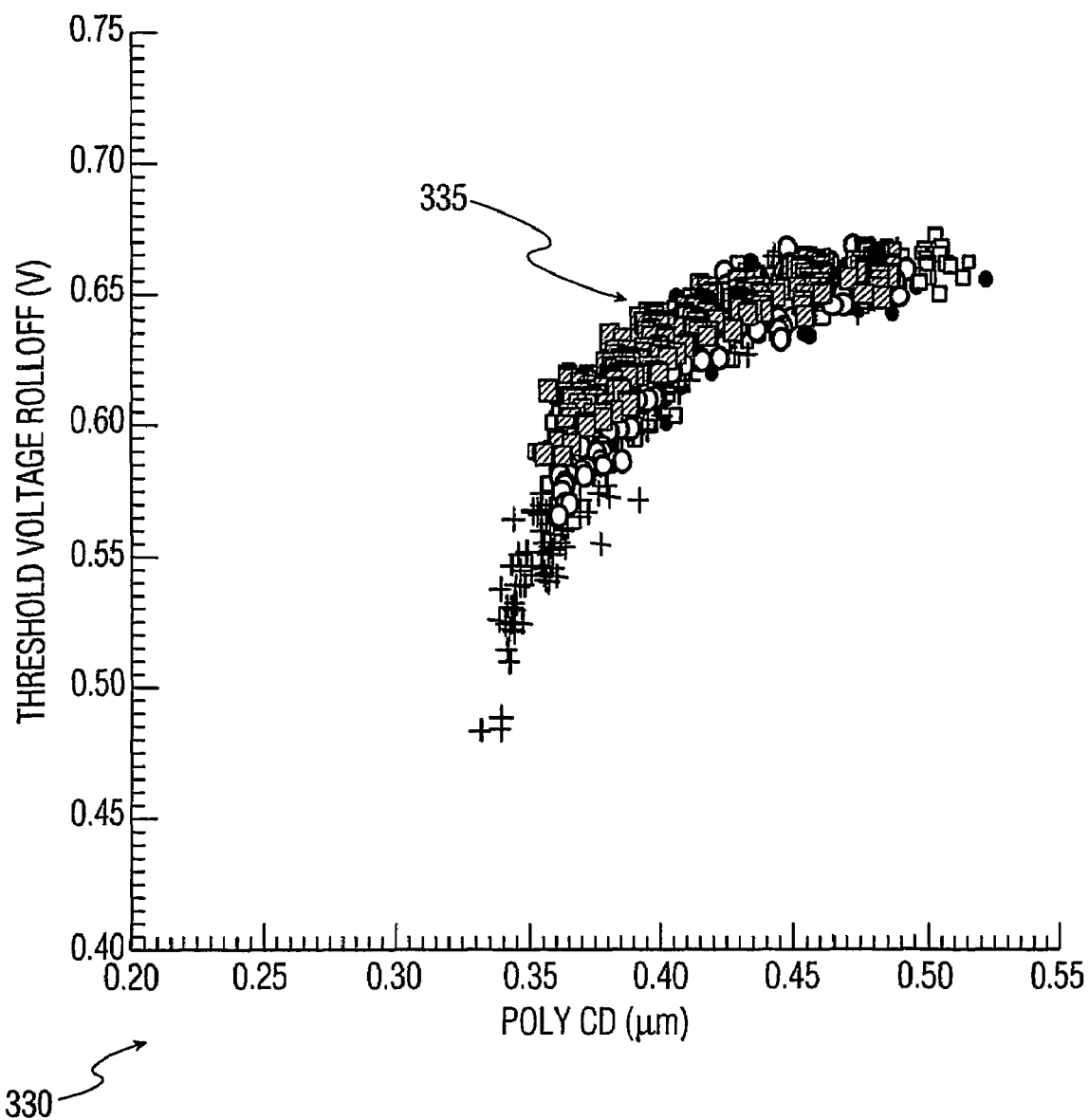
Figure 2D:
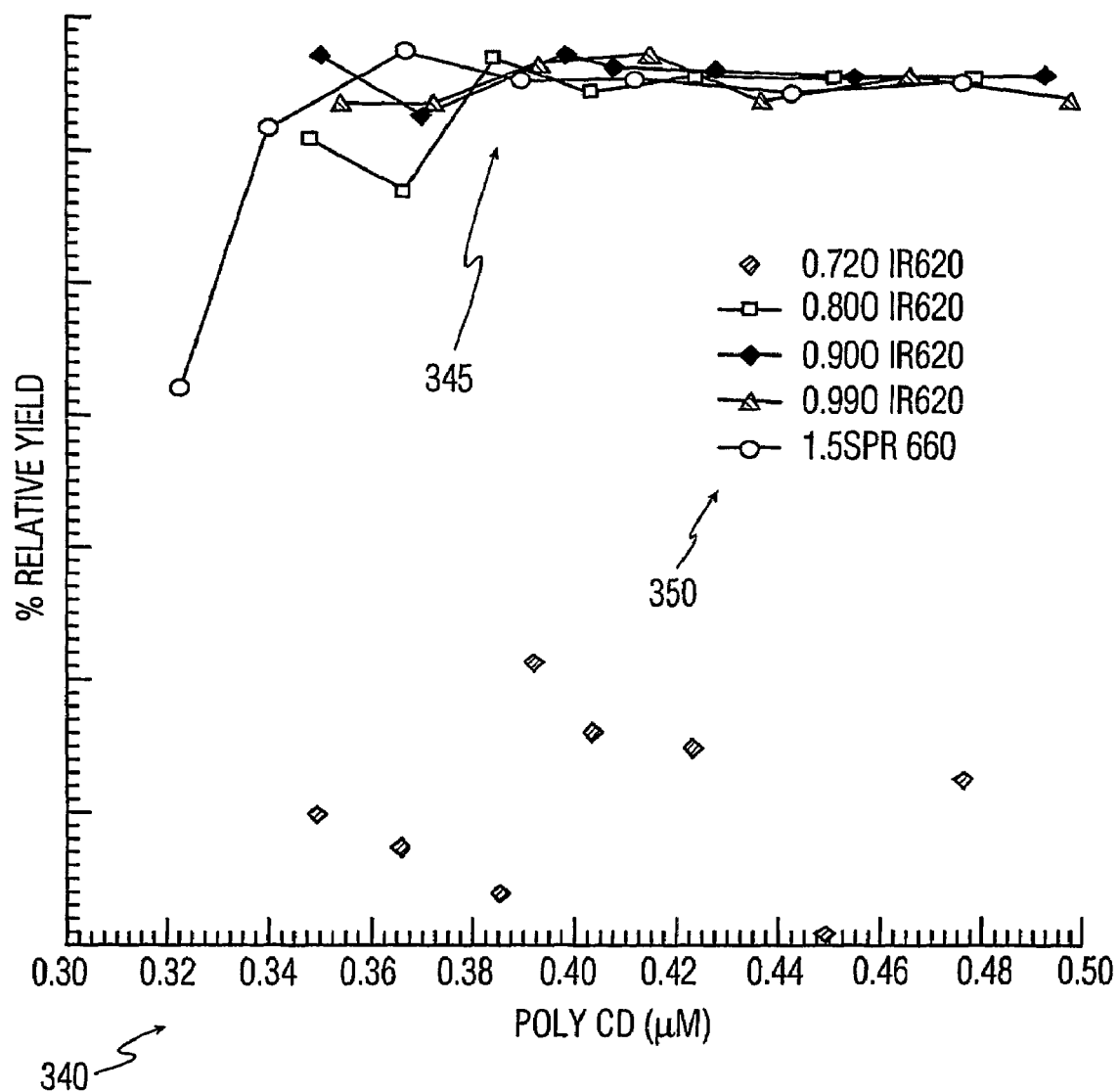
Figure 3:
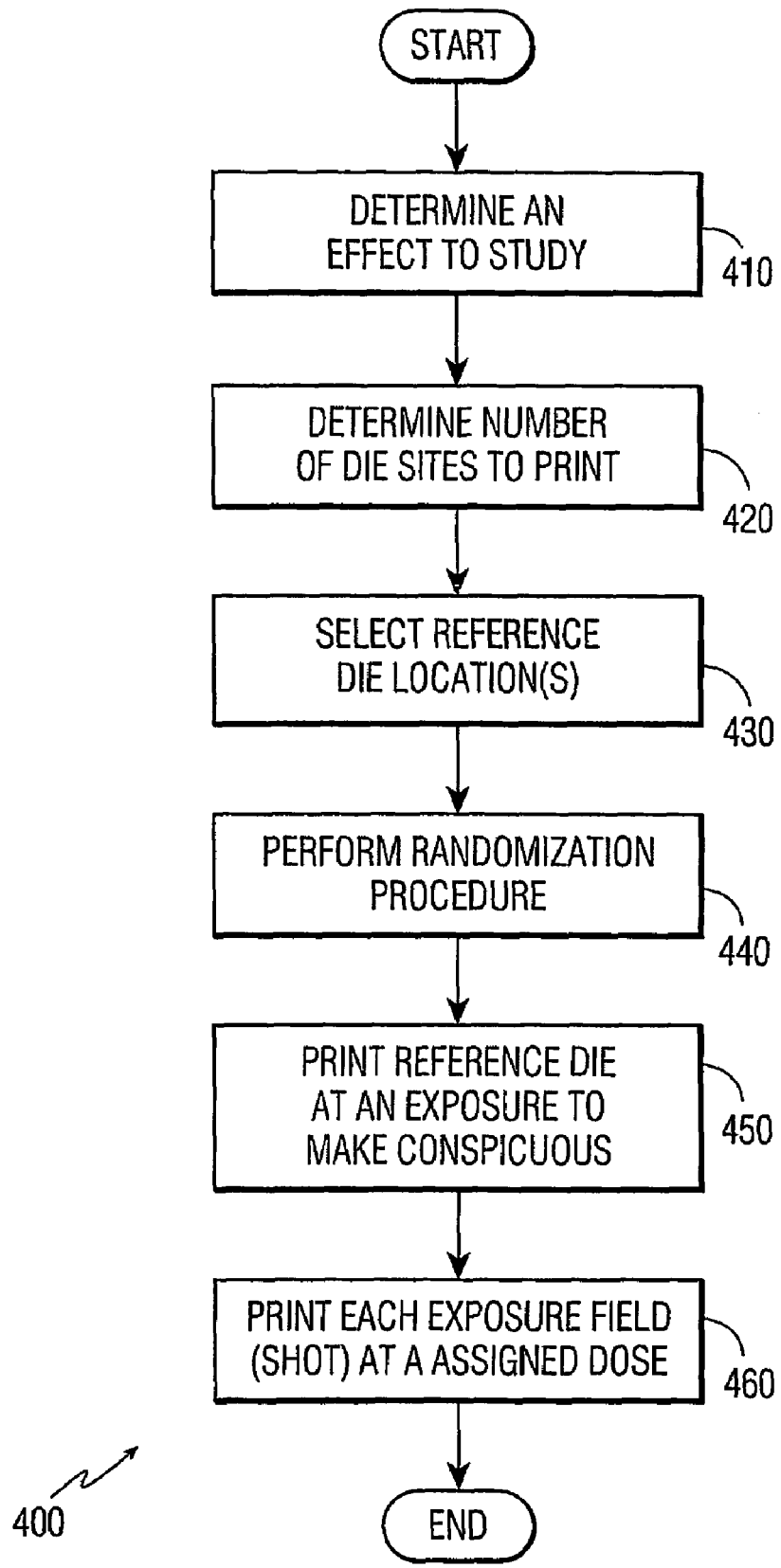

The invention may be more completely understood in consideration of the following detailed description of various embodiments of the invention in connection with the accompanying drawings, in which:

FIG. 1 outlines the steps involved in printing exposure doses according to an embodiment of the present invention;

FIG. 2A illustrates an example line width map of a substrate exposed to characterize polysilicon gate width effects versus yield according to an embodiment of the present invention;

FIG. 2B in an example process according to the present invention, depicts the correlation between electrical measurements of polysilicon CD v. inline scanning electron microscope (SEM) CD measurements;

FIG. 2C of the example process, depicts the threshold voltage ($V_t$) roll off curve as a function of polysilicon line width;

FIG. 2D of the example process, shows the relative yield as a function of line width for five different poly-silicon lithography processes; and FIG. 3 outlines the steps in involved in obtaining the data in an example process, as depicted in FIGS. 2A-2D, according to an embodiment of the present invention The present invention has been found to be useful in overcoming two challenges the user may encounter in performing exposure characterizations at the wafer level, namely confounding yield with systemic defects in which the user cannot discern and correlate a particular systemic wafer-to-wafer yield variation and the alignment of exposure fields with yield maps, in which the user may correlate a particular exposure field with yield. Yield would be the number of product or test die successfully passing electrical testing. Often yield may be expressed as a percentage of good die versus the number of die tested.

To minimize the likelihood of confounding yield with systematic across wafer defects, an approach according to an embodiment of the present invention, is to randomize exposure conditions across the wafer. Refer to FIG. 1. One example method is to generate a list of random numbers 210. A random number is assigned to each exposure field 220. The list of exposure fields/random numbers is sorted by random number 230. Exposure doses are assigned to this List sorted by random number 240. The list is sorted again by exposure field 250. Each Exposure Field is printed at an assigned dose 260.

In another example embodiment according to the present invention, a group of 21 stepper shots has random numbers assigned to each shot. Random numbers may be generated by a number of methods that are well known. They may be generated manually through the use of random number tables or be done in a data processing system that includes computers or calculating apparatus. Software routines may be utilized to generate the requisite list of random numbers. Such routines may be present on a standalone computer or via a network of client/server computers. Refer to Table 1 for the case of 21 exposure fields. The Table 1 list is sorted by random number.

Refer to Table 2. Refer to Table 2. Seven levels of exposure doses are desired with three replicates of the same exposure conditions (e.g. same dose, focus, etc). The seven exposure doses are assigned to the 21 shots in groups of 3

The list of Table 2 then is sorted by stepper shot to provide the randomized shot by dose assignment. Refer to Table 3. Of course, fields can be excluded from the randomization list if they are systematically different. For example, some fields are only partially on the wafer and could systematically yield differently from interior fields due to focus effects.

TABLE 1

Random Numbers Assigned to Stepper Shot Numbers

| Random # | Shot No. |
|---|---|
| 10.94668156 | 1 |
| 39.92199435 | 2 |
| 28.49234129 | 3 |
| 39.97451674 | 4 |
| 47.11274191 | 5 |
| 80.0428629 | 6 |
| 95.03925704 | 7 |
| 6.037389413 | 8 |
| 15.3710325 | 9 |
| 14.3341212 | 10 |
| 82.40351336 | 11 |
| 1.676129805 | 12 |
| 36.07767456 | 13 |
| 44.41655076 | 14 |
| 96.53699358 | 15 |
| 10.86162017 | 16 |
| 59.76862135 | 17 |
| 8.762993949 | 18 |
| 22.08926137 | 19 |
| 82.49627786 | 20 |
| 17.07756739 | 21 |

TABLE 2

Sorting by Random Numbers and Attaching Exposure Doses

| Random # | Shot No. | Dose |
|---|---|---|
| 1.676129805 | 12 | Dose1 |
| 6.037389413 | 8 | Dose1 |
| 8.762993949 | 18 | Dose1 |
| 10.86162017 | 16 | Dose2 |
| 10.94668156 | 1 | Dose2 |
| 14.3341212 | 10 | Dose2 |
| 15.3710325 | 9 | Dose3 |
| 17.07756739 | 21 | Dose3 |
| 22.08926137 | 19 | Dose3 |
| 28.49234129 | 3 | Dose4 |
| 36.07767456 | 13 | Dose4 |
| 39.92199435 | 2 | Dose4 |
| 39.97451674 | 4 | Dose5 |
| 44.41655076 | 14 | Dose5 |
| 47.11274191 | 5 | Dose5 |
| 59.76862135 | 17 | Dose6 |
| 80.0428629 | 6 | Dose6 |
| 82.40351336 | 11 | Dose6 |
| 82.49627786 | 20 | Dose7 |
| 95.03925704 | 7 | Dose7 |
| 96.53699358 | 15 | Dose7 |

TABLE 3

Randomization Results by Shot Number

| Random # | Shot No. | Dose |
|---|---|---|
| 10.94668156 | 1 | Dose2 |
| 39.92199435 | 2 | Dose4 |
| 28.49234129 | 3 | Dose4 |
| 39.97451674 | 4 | Dose5 |
| 47.11274191 | 5 | Dose5 |
| 80.0428629 | 6 | Dose6 |
| 95.03925704 | 7 | Dose7 |
| 6.037389413 | 8 | Dose1 |
| 15.3710325 | 9 | Dose3 |
| 14.3341212 | 10 | Dose2 |
| 82.40351336 | 11 | Dose6 |
| 1.676129805 | 12 | Dose1 |
| 36.07767456 | 13 | Dose4 |
| 44.41655076 | 14 | Dose5 |

TABLE 3-continued

Randomization Results by Shot Number

| Random # | Shot No. | Dose |
|---|---|---|
| 96.53699358 | 15 | Dose7 |
| 10.86162017 | 16 | Dose2 |
| 59.76862135 | 17 | Dose6 |
| 8.762993949 | 18 | Dose1 |
| 22.08926137 | 19 | Dose3 |
| 82.49627786 | 20 | Dose7 |
| 17.07756739 | 21 | Dose3 |

In another embodiment according to the present invention, the challenge of aligning the stepper map to the wafer sort or parameter test (pTest) map may be addressed by intentionally rendering one off center stepper field much different than the others in such a way that the wafer sort or pTest maps explicitly thereby, determining the correspondence. Parameter tests may include the testing of representative components of a device at various stages in the device's fabrication. Such tests may include but are not limited to transistors, resistors, diodes, contact and via chains, etc. Simple circuits, such as ring oscillators, memory modules, etc. may be built from the transistors and other representative components.

For example, at a potentially critical polysilicon layer, one field can be severely overexposed causing all die in that field to exhibit extraordinary leakage current. Another possibility would be not expose one field that would lead to a gross problem. For example, at a metallization step, all die in that field would be nonfunctional owing to short circuits. After sorting, the chips that exhibit the extraordinary failure are assigned a stepper field based on the stepper map. Corrections for differences in orientation can be determined as long as the reference mark die is offcenter. Refer to FIG. 2A. Wafer map 300 shows an example of line widths measured across a wafer intended to characterize the effect of line width on yield. Note that the reference die 310 is about 0.10 μm smaller than the next smallest line width, the dimensions being about 0.279 μm.

In an example process according to an embodiment of the present invention, it was desired to characterize the line width dependence on parametrics and yield of 5 different resist coat programs at the polysilicon gate layer for a 0.35 μm double poly layer nonvolatile memory process. To accomplish this within one lot of twenty-five 200 mm wafers, five wafers were coated with each resist process and then each wafer was exposed with the same randomized pattern of 7 exposure doses. One exposure field was deliberately overexposed so that it would serve as a marker to correlate inline measurements to parametric and yield data. Note that without this technique, it is nontrivial to unambiguously associate individual small die with to stepper field placement. The reference die 310 exhibits very strong leakage that unambiguously allows the sort map to be correlated to the line width across that wafer. Line widths at all sites on all wafers were measured at the poly silicon layer.

FIG. 2B shows the correlation between electrical and inline SEM measurements. The plot 320 is depicts a curve 325 of SEM poly CD measurements versus the deviation of the how such a SEM measurement behaves electrically. A deviation of zero means that the physical poly CD measurements exactly correlate with the electrical poly CD measurement.

Another parameter associated with poly silicon CD is threshold voltage roll off. Refer to FIG. 2C. Plot 330 depicts a plot of the poly silicon CD v. threshold voltage roll off 335.

Yield analysis using this technique is a challenge since each exposure field encompasses multiple chips (20 in this case). The grossly overexposed field causes an expected leakage loss of all die within that field. This allows the inline line width and yield maps to be exactly correlated to one another. Consequently, each chip within the wafer can then be unambiguously associated with an exposure field and inline poly CD measurement. Yield as a function of average line width may be calculated from the ratio of good chips to exposed chips at each dose. FIG. 2D shows the relative yield as a function of line width for 5 different poly coat processes. The plot 340 depicts a percentage yield versus poly CD curve 345. Five example resist processes 350 are plotted. Note that each data point of each curve 345 is the average of 700 to 1000 die. It should be emphasized that the data shown in FIGS. 2B-2D were obtained from only 25 wafers and that the line width dependence on parametric performance and yield of 5 unique resist processes was completely characterized within this one lot.

In other processes characterized according to the present invention, characterizing the effect of alignment at multiple levels using randomized exposure conditions may be applied. For example, a study may be done with poly-silicon and metallization in a combination experiment. These characterizations may illustrate a statistically based framework for doing and analyzing lithography experiments across individual wafers.

Refer to FIG. 3. In an example embodiment according to the present invention, the user may follow the process 400 to fabricate a characterization wafer, as shown by example of FIG. 2A. The user in his or her experience in a given wafer fabrication process may be encountering loss of wafers with a concomitant increase in cost at a particular step in a complex modern sub-micron process. As mentioned earlier, the process may be undergoing challenges in the area of printing features in the poly-silicon layer of an example CMOS process. The user determines an effect to study 410. The number of die sites to print has to be determined 420. Usually, the number of sites to print has already been defined by the production die already in the line. To be able to correlate the line-width with an electrical test, one or more reference die locations are selected 430. A randomization procedure is performed 440. For example, the user may follow randomization procedure 205 outlined in FIG. 1. Having done the randomization procedure 440, the user may choose to print the reference die(s) at an exposure to make them conspicuous 450 (i.e., detectable by electrical testing). After printing the reference die(s), each exposure field is printed at an assigned dose 460. For example, the poly-silicon leakage as discussed in relation to FIG. 2A correlates strongly to leakage current. One or more reference dies are usually printed in an off-center position. The reference dies may be printed at four quadrants of the wafer. The particular yield limiting issue and process often guides the user as to the appropriate number and placement of reference dies.

This approach of using a single wafer overcomes a challenge of one wafer at a time characterization, is that it is insensitive to wafer-to-wafer effects. For example, if an unrelated defect issue affects a single wafer exposed at a particular dose, then yield loss may be incorrectly attributed to the line widths printed on that particular wafer. Also, by randomizing, the effects of systematic across wafer effects on yield are reduced. Finally, this approach uses fewer wafers than the standard one wafer-at-a-time characterization.

The present invention may be incorporated as an additional feature to wafer stepping equipment. A number of vendors, such as CANON, ASML, and NIKON, manufacture such equipment. Such equipment of often computer-controlled and the user may program complex routines for production, test, and characterization.

In example embodiment according to the present invention, a wafer stepper may have a routine for characterizing a wafer substrate during a given process. For example, specific procedures may be programmed into the computer controlling the stepper. The characterization program may reside in program memory, optical, magnetic storage, or may reside in a client/server configuration as part of an internal intranet or the Internet. As part of an in-line monitoring system, a sample substrate out of a run of 25, may be designated for test. The user enters into the computer controlling the wafer stepper the effects he or she wants to study. The computer generates a list of which die sites to print for a given mask and wafer combination. The computer selects reference die locations. The computer performs a randomization procedure. Having selected the randomization of the die location and the selecting of reference die locations, the computer commands the wafer stepper to print the die at an assigned exposure parameter.

While the present invention has been described with reference to several particular example embodiments, those skilled in the art will recognize that many changes may be made thereto without departing from the spirit and scope of the present invention, which is set forth in the following claims.

What is claimed is:

1. A method for randomizing exposure conditions across a substrate comprising:
   generating a list of random numbers;
   mapping a random number to an exposure field, forming a list of random numbers and corresponding exposure fields;
   sorting the list of random numbers and exposure fields by random number;
   assigning an exposure dose to each exposure field in the list sorted by random number; and
   sorting the list by exposure field.

2. The method of claim 1 farther comprising: printing the exposure field at the assigned exposure dose.

3. A method for characterizing lithography effects on a wafer, the method comprising:
   determining an effect to study;
   determining a number of exposure fields to print;
   selecting at least one reference die location;
   performing a randomization procedure;
   printing the reference die at an exposure to make the reference die conspicuous; and
   printing each exposure field at the assigned exposure dose.

4. The method of claim 3, further comprising, performing electrical measurements on the wafer; and correlating the electrical measurements with line width.

5. The method of claim 3, wherein the reference-die location is off-center.

6. The method of claim 3 wherein, selecting reference die locations is in four quadrants on the wafer.

7. The method of claim 3 wherein performing a randomization procedure comprises,
   generating a list of random numbers;
   mapping a random number to an exposure field,
   forming a list of random numbers and corresponding exposure fields;
   sorting the list of random numbers and exposure fields by random number;
   assigning an exposure dose to each exposure field in the list sorted by random number; and
   sorting the list by exposure field.

8. System for characterizing lithography effects on a wafer, comprising:
- means for generating a list of random numbers;
- means for mapping a random number to an exposure field, forming a list of random numbers and corresponding exposure fields;
- means for sorting the list of random numbers and exposure fields by random number;
- means for assigning an exposure dose to each exposure field in the list sorted by random number;
- means for sorting the list by exposure field; and
- means for printing the exposure field at an assigned dose.

9. The system of claim 8 farther comprising, means for selecting at least one reference die location; and means for printing the reference die at an exposure to make the reference die conspicuous.

10. A method of manufacturing an electronic device comprising a step of exposing a photosensitive layer with a predetermined dose, which predetermined dose is determined with a method according to claim 3.

11. A method of manufacturing an electronic device comprising:
- coating the wafer with a photo resist forming a photo-sensitive layer;
- exposing the photo resist with a predetermined dose, the dose predetermined with a method comprising,
- characterizing lithography effects on the photo-sensitive layer of the wafer, the characterization comprising:
- determining an effect to study;
- determining a number of exposure fields to print;
- selecting at least one reference die location;
- performing a randomization procedures;
- printing the reference die on the photo-sensitive layer at an exposure to make the reference die conspicuous; and
- printing each exposure field on the photo-sensitive layer at an assigned exposure dose.

* * * * *